(12) United States Patent
Chan et al.

(10) Patent No.: US 11,437,983 B2
(45) Date of Patent: Sep. 6, 2022

(54) CIRCUIT FOR SUPPRESSING ELECTROMAGNETIC INTERFERENCE

(71) Applicant: AnApp Technologies Limited, Kowloon (HK)

(72) Inventors: Peter On Bon Chan, Shatin (HK); Siu Hong Wong, Ma on Shan (HK)

(73) Assignee: AnApp Technologies Limited, Kowloon (HK)

( * ) Notice: Subject to any disclaimer, the term of this patent is extended or adjusted under 35 U.S.C. 154(b) by 0 days.

(21) Appl. No.: 17/275,583

(22) PCT Filed: Aug. 16, 2019

(86) PCT No.: PCT/CN2019/101107
§ 371 (c)(1),
(2) Date: Mar. 11, 2021

(87) PCT Pub. No.: WO2021/030964
PCT Pub. Date: Feb. 25, 2021

(65) Prior Publication Data
US 2021/0305974 A1   Sep. 30, 2021

(51) Int. Cl.
*H03K 5/125* (2006.01)
*H03K 5/1252* (2006.01)
*H03F 3/04* (2006.01)
*H03H 11/04* (2006.01)

(52) U.S. Cl.
CPC .............. *H03K 5/1252* (2013.01); *H03F 3/04* (2013.01); *H03H 11/04* (2013.01)

(58) Field of Classification Search
CPC ......... H03K 5/1252; H03F 3/04; H03H 11/04
See application file for complete search history.

(56) References Cited

U.S. PATENT DOCUMENTS

| | | | |
|---|---|---|---|
| 9,048,817 B2* | 6/2015 | Shen | H02M 1/15 |
| 10,396,656 B1* | 8/2019 | Poon | H04B 15/00 |
| 10,653,050 B2* | 5/2020 | Han | H01F 27/24 |

(Continued)

FOREIGN PATENT DOCUMENTS

| | | |
|---|---|---|
| CN | 1394387 A | 1/2003 |
| CN | 101010874 A | 8/2007 |

(Continued)

*Primary Examiner* — Dinh T Le
(74) *Attorney, Agent, or Firm* — Renner Kenner Greive Bobak Taylor & Weber (57) ABSTRACT

A circuit for suppressing electromagnetic interference signal on power lines. The circuit includes a first sensing circuit, a first amplifier, and a first controlled signal source. The first sensing circuit is arranged to sense a first electromagnetic interference signal. The first amplifier is arranged to be powered by a power source. The first amplifier provides a first amplification factor and being operably connected with the first sensing circuit to amplify a signal sensed by the first sensing circuit. The first controlled signal source provides a second amplification factor and is operably connected with the first amplifier to regulate or further amplify the amplified signal to provide a first suppression signal that reduces the first electromagnetic interference signal. Multiple such circuits can be cascaded to form a mufti-stage electromagnetic interference suppression circuit.

18 Claims, 3 Drawing Sheets

(56) References Cited

U.S. PATENT DOCUMENTS

2002/0063474 A1    5/2002   Wasaki et al.
2009/0027136 A1    1/2009   Traa et al.

FOREIGN PATENT DOCUMENTS

| CN | 105356740 | A | 2/2016 |
|----|-----------|---|--------|
| CN | 206807285 | U | 12/2017 |
| CN | 108418569 | A | 8/2018 |
| EP | 3799304 | A1 | 3/2021 |
| KR | 20160123034 | A | 10/2016 |

\* cited by examiner

CIRCUIT FOR SUPPRESSING ELECTROMAGNETIC INTERFERENCE

TECHNICAL FIELD

The invention relates to a circuit for suppressing electromagnetic interference, in particular an active circuit for suppressing electromagnetic interference.

BACKGROUND

Electromagnetic interference suppression is a commonly-used technique for suppressing conducted electromagnetic interference signals present on power lines, e.g., during operation of an electrical device. These conducted electromagnetic interference signals can be classified into differential mode electromagnetic interference signals, which are conducted on the power supply line and the power return line in opposite directions, and common mode electromagnetic interference signals, which are conducted on the power supply line and the power return line in the same direction.

In some applications, the conducted electromagnetic interference signals generated have a relatively large magnitude above regulatory limits, making the suppression more difficult.

SUMMARY OF THE INVENTION

In accordance with a first aspect of the invention, there is provided a circuit for suppressing electromagnetic interference signal on power lines. The circuit comprises a first sensing circuit, a first amplifier, and a first controlled signal source. The first sensing circuit is arranged to sense a first electromagnetic interference signal. The first amplifier is arranged to be powered by a power source. The first amplifier provides a first amplification factor and is operably connected with the first sensing circuit to amplify a signal sensed by the first sensing circuit. The first controlled signal source provides a second amplification factor and is operably connected with the first amplifier to regulate or further amplify the amplified signal to provide a first suppression signal that reduces the first electromagnetic interference signal. The first electromagnetic interference signal may be a voltage signal and the first suppression signal may be a voltage signal. The first electromagnetic interference signal may be a conducted electromagnetic interference signal or like noise signals.

Preferably, the first suppression signal substantially eliminates the first electromagnetic interference signal.

Preferably, the power lines include a higher potential power line and a lower potential power line; the first amplifier includes a first higher potential power terminal and a first lower potential power terminal for connection with its power source. At least one of: the higher potential power line and the first higher potential power terminal are at the same potential, and the lower potential power line and the first lower potential power terminal are at the same potential.

Preferably, a product of the first amplification factor and the second amplification factor is about −1.

Preferably, the first sensing circuit is a high pass circuit. The high pass circuit may consist only of passive circuit components. In one example, the high pass circuit comprises a resistor and a capacitor connected in series.

Preferably, the first controlled signal source is a controlled voltage source. In one example, the first controlled signal source comprises a transformer with primary coils and second coils defining a turns-ratio. The second amplification factor is defined by the turns ratio.

The first amplifier may be implemented using one or more of: transistor(s), operation amplifier(s), etc. The first amplifier may be a sub-circuit of an integrated circuit or integrated circuit chip.

In one embodiment of the first aspect, the first amplifier comprises a single input amplifier. The first sensing circuit comprises a resistor and a capacitor connected in series, and the single input amplifier is connected to a node between the resistor and the capacitor.

In one embodiment of the first aspect, the first amplifier comprises a differential input amplifier. The first sensing circuit comprises a resistor and a capacitor connected in series, and the differential input amplifier is connected across the resistor and not the capacitor.

In one embodiment of the first aspect, the circuit further comprises a second sensing circuit, a second amplifier, and a second controlled signal source. The second sensing circuit arranged to sense a second electromagnetic interference signal. The second electromagnetic interference signal is the reduced first electromagnetic interference signal. The second amplifier is arranged to be powered by a power source. The second amplifier provides a third amplification factor and is operably connected with the second sensing circuit to amplify a signal sensed by the second sensing circuit. The second controlled signal source provides a fourth amplification factor and is operably connected with the second amplifier to regulate or further amplify the amplified signal to provide a second suppression signal that reduces the second electromagnetic interference signal. The second electromagnetic interference signal may be a voltage signal and the second suppression signal may be a voltage signal. The second electromagnetic interference signal may be a conducted electromagnetic interference signal or like noise signals.

Preferably, the first and second sensing circuits have the same or substantially the same structure, e.g., formed by the same or same type of circuit components.

Preferably, the first and second amplifiers have the same or substantially the same structure, e.g., formed by the same or same type of circuit components Preferably, the first and second controlled signal sources have the same or substantially the same structure, e.g., formed by the same or same type of circuit components.

Preferably, the second suppression signal substantially eliminates the second electromagnetic interference signal.

In one embodiment of the first aspect, the first amplifier includes a first higher potential power terminal and a first lower potential power terminal for connection with its power source, and the second amplifier includes a second higher potential power terminal and a second lower potential power terminal for connection with its power source. The first higher potential power terminal and the second higher potential power terminal are connected at the same potential, and the first lower potential power terminal and the second lower potential power terminal are connected at the same potential.

In one embodiment of the first aspect, the power lines include a higher potential power line and a lower potential power line. And at least one of: the higher potential power line, the first higher potential power terminal, and the second higher potential power terminal are at the same potential; and the lower potential power line, the first lower potential power terminal, and the second lower potential power terminal are at the same potential.

Preferably, the power source of the first amplifier and the power source of the second amplifier are the same power source.

Preferably, a product of the third amplification factor and the fourth amplification factor is about −1.

Preferably, the second sensing circuit is a high pass circuit. The high pass circuit may consist only of passive circuit components. In one example, the second sensing circuit comprises a resistor and a capacitor connected in series.

Preferably, the second controlled signal source is a controlled voltage source. In one example, the second controlled signal source comprises a transformer with primary coils and second coils defining a turns ratio. The fourth amplification factor is defined by the turns ratio.

The second amplifier may be implemented using one or more of: transistor(s), operation amplifier(s), etc. The second amplifier may be a sub-circuit of an integrated circuit or integrated circuit chip.

In one embodiment of the first aspect, the second amplifier comprises a single input amplifier. The second sensing circuit comprises a resistor and a capacitor connected in series, and the single input amplifier is connected to a node between the resistor and the capacitor.

In one embodiment of the first aspect, the second amplifier comprises a differential input amplifier. The second sensing circuit comprises a resistor and a capacitor connected in series, and the differential input amplifier is connected across the resistor and not the capacitor.

In accordance with a second aspect of the invention, there is provided a circuit for suppressing electromagnetic interference signal on power lines. The circuit comprises a plurality of circuit stages for suppressing an electromagnetic interference signal in stage. Each of the plurality of circuit stages having: a sensing circuit arranged to sense an electromagnetic interference signal; an amplifier, powered by a power source, and operably connected with the sensing circuit to amplify a signal sensed by the sensing circuit; and a controlled signal source operably connected with the amplifier to regulate or further amplify the amplified signal to provide a suppression signal that reduces the electromagnetic interference signal.

Preferably, the amplifiers each includes a higher potential power terminal and lower potential power terminal for connection with its respective power source, wherein the higher potential power terminals of the amplifiers are connected at the same potential and the lower potential power terminals of the amplifiers are connected at the same potential.

Preferably, the amplifiers are powered by the same power source.

In accordance with a third aspect of the invention, there is provided a circuit of the first aspect.

In accordance with a fourth aspect of the invention, there is provided a circuit of the second aspect.

BRIEF DESCRIPTION OF THE DRAWINGS

Embodiments of the invention will now be described, by way of example, with reference to the accompanying drawings in which.

DETAILED DESCRIPTION

Figure 1:
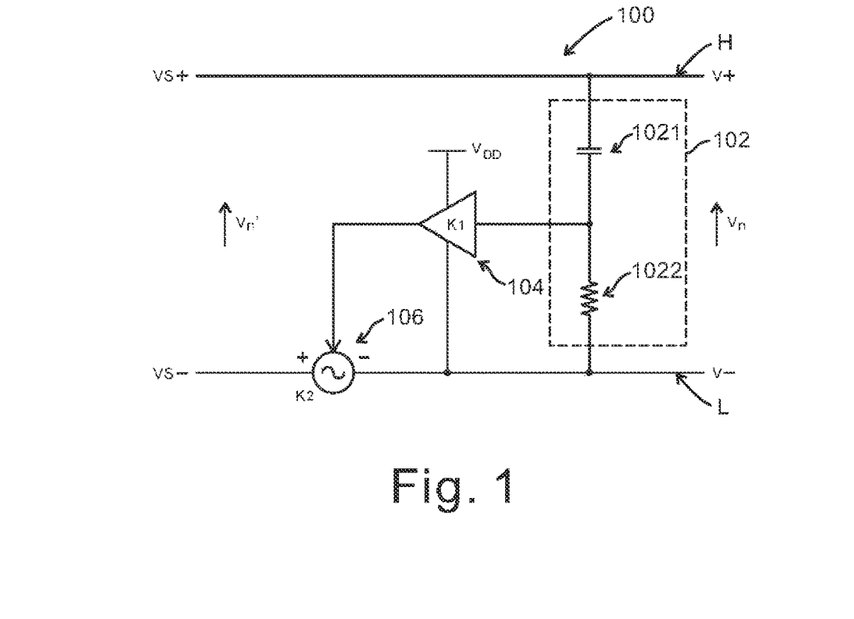
FIG. 1 is an electromagnetic interference suppression circuit in a first embodiment of the invention.

FIG. 1 shows a circuit 100 for suppressing electromagnetic interference signal on power lines in one embodiment of the invention. In FIG. 1, the circuit 100 is connected across a higher potential power line H and a lower potential power line L. The higher and lower potential power lines H, L are arranged to provide energy to an electrical appliance or load (not shown). During operation of the electrical appliance, electromagnetic interference signal, represented by voltage signal $V_n$, is generated. The circuit 100 is operable to reduce, and preferably substantially eliminate, the electromagnetic interference signal $V_n$.

The circuit 100 generally includes a sensing circuit 102 connected across the power lines H, L for sensing the electromagnetic interference signal, an amplifier 104 connected with the sensing circuit 102 for amplifying a signal sensed by the sensing circuit 102, and a controlled voltage source 106 connected with the amplifier 104 and the lower potential power line L, to regulate the amplified signal and provide a suppression signal to reduce the electromagnetic interference voltage signal $V_n$.

The sensing circuit 102 includes a capacitor 1021 and a resistor 1022 connected in series and across the power lines H, L to sense the electromagnetic interference voltage signal $V_n$. The sensing circuit 102 forms a high pass circuit or filter. The amplifier 104, in the form of a single input amplifier, is connected to the sensing circuit 102. The amplifier 104 has an input terminal connected to a node between the capacitor 1021 and the resistor 1022, and an output terminal connected to the controlled voltage source 106. The amplifier 104, with an amplification factor $K_1$, is arranged to amplify the signal (e.g., the signal $V_n$) sensed by the sensing circuit 102 by $K_1$. The amplified signal is provided to the controlled voltage source 106. Essentially, the output of the amplifier 104 is used as a control input for the controlled voltage source 106. The amplifier 104 also has higher and lower potential power terminals for connection with a power source. In this example, the power source has a terminal at potential VDD connected to the higher potential power terminal and a terminal at potential V− connected to the lower potential power terminal. The controlled voltage source 106, with a second amplification factor $K_2$, takes the amplified signal from the amplifier 104 as input, regulates or amplifies it with $K_2$, and outputs a suppression signal that reduces the electromagnetic interference voltage signal $V_n$. The suppression signal provided by the controlled voltage source 106 may be out of phase, preferably substantially 180 degrees out of phase, with the electromagnetic interference voltage signal $V_n$ for effectively reducing the electromagnetic interference voltage signal $V_n$.

The controlled voltage source 106 can be implemented with a transformer that includes a primary winding connected between the output of amplifier 104 and the lower potential power line L (to serve as a control input), and a secondary winding connected on the lower potential power line (across potentials VS− and V−) to serve as an output. The turns-ratio of the transformer defines (e.g., equals to or proportional to) the amplification factor $K_2$.

In theory, if the product of $K_1$ and $K_2$ is $-1$, then the suppression signal provided by the controlled voltage source 106 is equal in magnitude and 180 degrees out of phase with the electromagnetic interference voltage signal $V_n$. The resultant electromagnetic interference voltage signal $V_n'$ across the potentials VS+ and VS− will be zero, i.e., the electromagnetic interference generated can be completely eliminated. In practice, however, because of operation conditions, environmental factors, etc., the product of $K_1$ and $K_2$ will hardly be exactly $-1$. In other words, the resultant electromagnetic interference voltage signal $V_n'$ across the potentials VS+ and VS− will be smaller than $V_n$ but not zero.

If the magnitude of the resultant electromagnetic interference voltage signal $V_n'$ across the power lines H, L is larger than a threshold value (e.g., a regulatory limit), one or more further circuit units with similar or same construction as circuit 100 can be added to further reduce or eliminate the resultant electromagnetic interference voltage signal $V_n'$.

Figure 2:
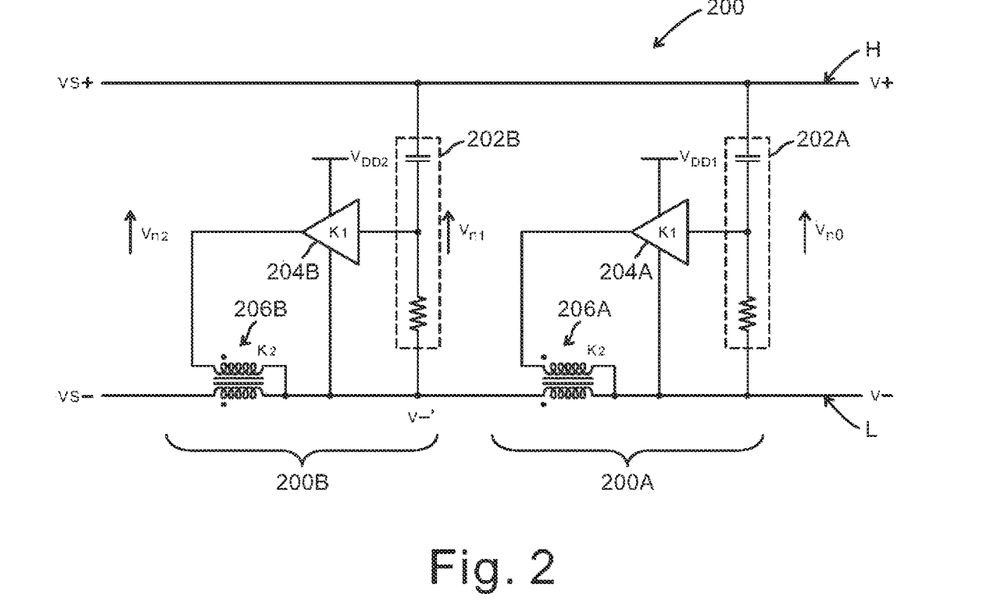
FIG. 2 is an electromagnetic interference suppression circuit in a second embodiment of the invention.

FIG. 2 shows a circuit 200 for suppressing electromagnetic interference signal on power lines in another embodiment of the invention. The circuit 200 essentially includes two cascaded circuits 100 of FIG. 1 for reducing, and preferably substantially eliminating, the electromagnetic interference signal $V_n$ or $V_{n0}$, in two stages.

The circuit 200 is connected across the higher potential power line H and a lower potential power line L. The circuit 200 includes a first circuit unit 200A and a second circuit unit 200B. The first circuit unit 200A generally includes a sensing circuit 202A connected across the power lines H, L for sensing the electromagnetic interference signal $V_n$, an amplifier 204A connected with the sensing circuit 202A for amplifying a signal sensed by the sensing circuit 202A, and a controlled voltage source in the form of a transformer 206A connected with the amplifier 204A and the lower potential power line L to regulate the amplified signal and provide a suppression signal to reduce the electromagnetic interference voltage signal $V_{no}$. The second circuit unit 200B generally includes a sensing circuit 202B connected across the power line H and and potential V− for sensing the reduced electromagnetic interference signal $V_{n1}$, an amplifier 204B connected with the sensing circuit 202B for amplifying a signal sensed by the sensing circuit 202B, and a controlled voltage source in the form of a transformer 206B connected with the amplifier 204B and the potential V−, to regulate the amplified signal and provide a suppression signal to reduce the residue electromagnetic interference voltage signal $V_{n1}$.

In the first circuit unit 200A, the sensing circuit 202A includes a capacitor and a resistor connected in series and across the power line H and the potential V− to sense the electromagnetic interference voltage signal $V_{n0}$. The single input amplifier 204A has an input terminal connected to a node between the resistor and the capacitor, and an output terminal connected to the transformer 206A. The amplifier 204A, with an amplification factor $K_1$, is arranged to amplify the signal (e.g., the signal $V_{n0}$) sensed by the sensing circuit 202A by $K_1$. The amplified signal is provided to the transformer 206A, more specifically to the primary coil of the transformer 206A. The amplifier 204A has higher and lower potential power terminals for connection with a power source. In this example, the power source has a terminal at potential VDD connected to the higher potential power terminal and a terminal at potential V− connected to the lower potential power terminal. The transformer 206A includes a primary winding connected between the output of amplifier 204A and the lower potential power line L (to serve as a control input) at potential V−, and a secondary winding connected on the low potential power line L (across potentials V− and V−') to serve as an output. The turns-ratio of the transformer 206A defines (e.g., equals to or proportional to) the amplification factor $K_2$. The transformer 206A provides a suppression signal that reduces the electromagnetic interference voltage signal from $V_{n0}$ to $V_{n1}$.

In the second circuit unit 200B, the sensing circuit 202B includes a capacitor and a resistor connected in series and across the power lines H, L to sense the electromagnetic interference voltage signal $V_{n1}$. The single input amplifier 204B has an input terminal connected to a node between the resistor and the capacitor, and an output terminal connected to the transformer 206B. The amplifier 204B, with an amplification factor $K_1$, is arranged to amplify the signal (e.g., the signal $V_{n1}$) sensed by the sensing circuit 202B by $K_1$. The amplified signal is provided to the transformer 206B, more specifically to the primary coil of the transformer 206B. The amplifier 204B has higher and lower potential power terminals for connection with a power source. In this example, the power source has a terminal at potential VDD connected to the higher potential power terminal and a terminal at potential V−' (different from V−) connected to the lower potential power terminal. The transformer 206B includes a primary winding connected between the output of amplifier 204B and the lower potential power line L (to serve as a control input) at potential V−', and a secondary winding connected across potentials VS− and V−' to serve as an output. The turns-ratio of the transformer 206B defines (e.g., equals to or proportional to) the amplification factor $K_2$. The transformer 206B provides a suppression signal that reduces the electromagnetic interference voltage signal $V_{n1}$ to $V_{n2}$.

The amplification factor $K_1$ of amplifier 204A and the amplification factor $K_1$ of amplifier 204B can be the same or different. The amplification factor $K_2$ of the transformer 206A and the amplification factor $K_2$ of transformer 206B can be the same or different. The product of the amplification factor $K_1$ of amplifier 204A and the amplification factor $K_2$ of the transformer 206A can be (but need not be) about $-1$. Likewise, the product of the amplification factor $K_1$ of amplifier 204B and the amplification factor $K_2$ of the transformer 206B can be (but need not be) about $-1$ In this embodiment, different power supplies are required for the amplifiers 204A, 204B because the reference potential (V−) of the first circuit unit 200A and the reference potential (V−') of the second circuit unit 200B are different. If the reference potential of the second circuit unit 200B is connected to V− instead of V−', the secondary coil of the transformer 206A (across potential V−' and V−) will become part of the $V_{n1}$ sensing circuit and current through the primary coil of the transformer 206B will be returned to V− through the secondary coil of the first circuit unit 200A. This may complicate or make incorrect the electromagnetic interference suppression. This circuit arrangement 200 may be undesirable when multi-stage electromagnetic interference suppression is required because the number of power supplies required for the amplifiers equals to number of circuit units (each has an amplifier).

Figure 3:
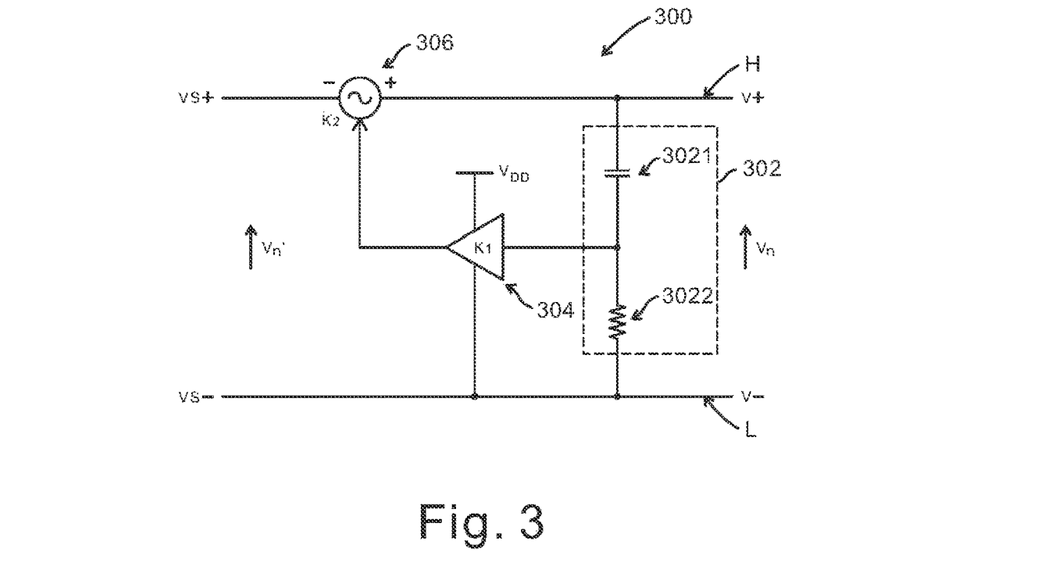
FIG. 3 is an electromagnetic interference suppression circuit in a third embodiment of the invention.

FIG. 3 shows a circuit 300 for suppressing electromagnetic interference signal on power lines in one embodiment of the invention. The circuit 300 is similar to the circuit 100 in FIG. 1: the sensing circuit 302 with capacitor 3021 and resistor 3022 corresponds to the sensing circuit 102 with capacitor 1021 and resistor 1022; the amplifier 304 corresponds to the amplifier 104; the controlled voltage source 306 corresponds to the controlled voltage source 106. The main difference between the circuit 300 and the circuit 100 is that the controlled voltage source 306 is connected to the higher potential power line H while the controlled voltage source 106 is connected to the lower potential power line L.

Figure 4:
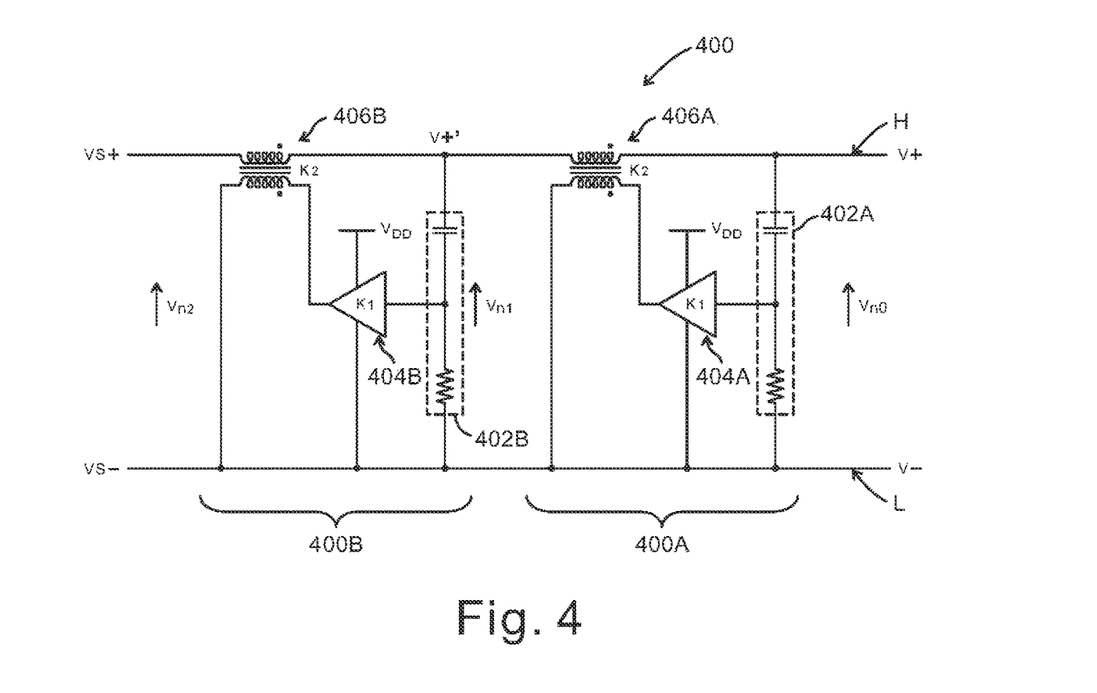
FIG. 4 is an electromagnetic interference suppression circuit in a fourth embodiment of the invention.

FIG. 4 shows a circuit 400 for suppressing electromagnetic interference signal on power lines in another embodiment of the invention. The circuit 400 essentially includes two cascaded circuits 300 of FIG. 3 for reducing, and preferably substantially eliminating, the electromagnetic interference signal $V_n$ or $V_{n0}$ in two stages.

The input side of the circuit 400 is connected across the higher potential power line H and a lower potential power line L. The circuit 400 includes a first circuit unit 400A and a second circuit unit 400B. The first circuit unit 400A generally includes a sensing circuit 402A connected across the power lines H, L for sensing the electromagnetic interference signal $V_n$, an amplifier 404A connected with the sensing circuit 402A for amplifying a signal sensed by the sensing circuit 402A, and a controlled voltage source in the form of a transformer 406A connected with the output of amplifier 404A as transformer primary side input and the transformer secondary output as suppression signal to reduce the electromagnetic interference voltage signal $V_{n0}$. The second circuit unit 400B generally includes a sensing circuit 402B connected across the power lines H, L for sensing the reduced electromagnetic interference signal $V_{n1}$, an amplifier 404B connected with the sensing circuit 402B for amplifying a signal sensed by the sensing circuit 402B, and a controlled voltage source in the form of a transformer 406B connected with the output of amplifier 404B as transformer primary side input and the transformer secondary output as suppression signal to reduce the residue electromagnetic interference voltage signal $V_{n1}$.

In the first circuit unit 400A, the sensing circuit 402A includes a capacitor and a resistor connected in series and across the power lines H, L to sense the electromagnetic interference voltage signal $V_{n0}$. The single input amplifier 404A has an input terminal connected to a node between the resistor and the capacitor, and an output terminal connected to the transformer 406A. The amplifier 404A, with an amplification factor $K_1$, is arranged to amplify the signal (e.g., the signal $V_{n0}$) sensed by the sensing circuit 402A by $K_1$. The amplified signal is provided to the transformer 406A, more specifically to the primary coil of the transformer 406A. The amplifier 404A has higher and lower potential power terminals for connection with a power source. In this example, the power source has a terminal at potential VDD connected to the higher potential power terminal and a terminal at potential V− (or VS−, same value) connected to the lower potential power terminal. The transformer 406A includes a primary winding connected between the output of amplifier 404A and the lower potential power line L (to serve as a control input) at potential V−, and a secondary winding connected across potentials V+ and V+' to serve as an output (e.g., at an opposite side of the lower potential power terminal of the amplifier). The turns-ratio of the transformer 406A defines (e.g., equals to or proportional to) the amplification factor $K_2$. The transformer 406A provides a suppression signal that reduces the electromagnetic interference voltage signal from $V_{n0}$ to $V_{n1}$.

In the second circuit unit 400B, the sensing circuit 402B includes a capacitor and a resistor connected in series and across the power lines H and the potential V+ to sense the electromagnetic interference voltage signal $V_{n1}$. The single input amplifier 404B has an input terminal connected to a node between the resistor and the capacitor, and an output terminal connected to the transformer 406B. The amplifier 404B, with an amplification factor $K_1$, is arranged to amplify the signal (e.g., the signal $V_{n1}$) sensed by the sensing circuit 402B by $K_1$. The amplified signal is provided to the transformer 406B, more specifically to the primary coil of the transformer 406B. The amplifier 404B has higher and lower potential power terminals for connection with a power source. In this example, the power source has a terminal at potential VDD connected to the higher potential power terminal and a terminal at potential V− (or VS−, same value) connected to the lower potential power terminal. The transformer 406B includes a primary winding connected between the output of amplifier 404B and the lower potential power line L (to serve as a control input) at potential V−, and a secondary winding connected across potentials VS+ and V+' to serve as an output (e.g., at an opposite side of the lower potential power terminal of the amplifier). The turns-ratio of the transformer 406B defines (e.g., equals to or proportional to) the amplification factor $K_2$. The transformer 406B provides a suppression signal that reduces the electromagnetic interference voltage signal $V_{n1}$ to $V_{n2}$ smaller than $V_{n1}$.

The amplification factor $K_1$ of amplifier 404A and the amplification factor $K_1$ of amplifier 404B can be the same or different. The amplification factor $K_2$ of the transformer 406A and the amplification factor $K_1$ of transformer 406B can be the same or different. The product of the amplification factor $K_1$ of amplifier 404A and the amplification factor $K_2$ of the transformer 406A can be (but need not be) about −1. Likewise, the product of the amplification factor $K_1$ of amplifier 404B and the amplification factor $K_2$ of the transformer 406B can be (but need not be) about −1.

In this embodiment, a single power supply can be used for powering the amplifiers 404A, 404B without affecting the suppression performance. The reference potential (V−) of the first circuit unit 400A and the reference potential (V−) of the second circuit unit 400B are the same. Importantly, the higher potential power terminals of the amplifiers 404A, 404B are at the same potential while the lower potential power terminals of the amplifiers 404A, 404B are at the same potential different from that of the higher potential power terminals. While in this embodiment V− is used as the reference potential, in other embodiments, V+ can be used as the reference potential, and the higher potential power terminal of the amplifiers 404A, 404B can be connected to V+. The lower potential power terminal of the amplifiers 404A, 404B can be connected to V− or a separate node.

Figure 5:
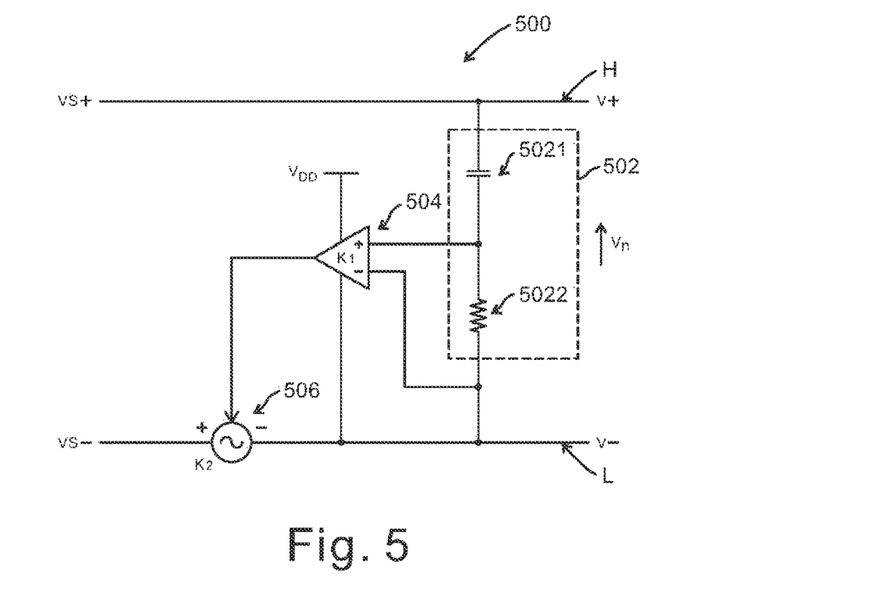
FIG. 5 is an electromagnetic interference suppression circuit in a fifth embodiment of the invention.

FIG. 5 shows a circuit 500 for suppressing electromagnetic interference signal on power lines in one embodiment of the invention. The circuit 500 is similar to the circuit 100 in FIG. 1: the sensing circuit 502 with capacitor 5021 and resistor 5022 corresponds to the sensing circuit 102 with capacitor 1021 and resistor 1022; the amplifier 504 corresponds to the amplifier 104; the controlled voltage source 506 corresponds to the controlled voltage source 106. The main difference between the circuit 500 and the circuit 100 is that the amplifier 504 is a differential amplifier with two inputs connected across only the resistor 5022 while the amplifier 104 is a single input amplifier with an input connected to a node between the capacitor 1021 and the resistor 1022.

Figure 6:
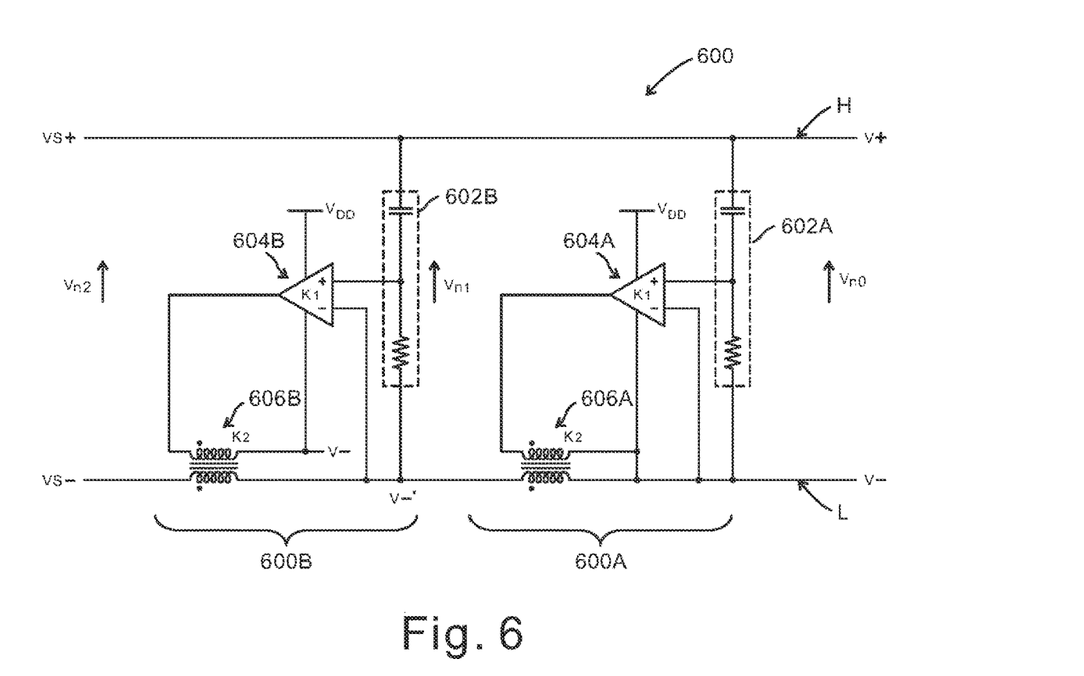
FIG. 6 is an electromagnetic interference suppression circuit in a sixth embodiment of the invention.

FIG. 6 shows a circuit 600 for suppressing electromagnetic interference signal on power lines in another embodiment of the invention. The circuit 600 essentially includes two cascaded circuits 500 of FIG. 5 for reducing, and preferably substantially eliminating, the electromagnetic interference signal $V_n$ or $V_{n0}$ in two stages.

The input side of the circuit 600 is connected across the higher potential power line H and a lower potential power line L. The circuit 600 includes a first circuit unit 600A and a second circuit unit 600B. The first circuit unit 600A generally includes a sensing circuit 602A connected across the power lines H, L for sensing the electromagnetic interference signal $V_{n0}$, an amplifier 604A connected with the sensing circuit 602A for amplifying a signal sensed by the sensing circuit 602A, and a controlled voltage source in the form of a transformer 606A connected with the output of amplifier 604A as transformer primary side input and the transformer secondary output as suppression signal to reduce the electromagnetic interference voltage signal $V_{no}$. The second circuit unit 600B generally includes a sensing circuit 602B connected across the power line H and the potential V− for sensing the reduced electromagnetic interference signal $V_{n1}$, an amplifier 604B connected with the sensing circuit 602B for amplifying a signal sensed by the sensing circuit 602B, and a controlled voltage source in the form of a transformer 606B connected with the output of amplifier 604B as transformer primary side input and the transformer secondary output as suppression signal to reduce the residue electromagnetic interference voltage signal $V_{n1}$.

In the first circuit unit 600A, the sensing circuit 602A includes a capacitor and a resistor connected in series and across the power lines H, L to sense the electromagnetic interference voltage signal $V_{n0}$. The differential amplifier 604A has two input terminals connected across the resistor and not the capacitor, and an output terminal connected to primary side of the transformer 606A. The amplifier 604A, with an amplification factor $K_1$, is arranged to amplify the signal (e.g., the signal $V_{n0}$) sensed by the sensing circuit 602A by $K_1$. The amplified signal is provided to the transformer 606A, more specifically to the primary coil of the transformer 606A. The amplifier 604A has higher and lower potential power terminals for connection with a power source. In this example, the power source has a terminal at potential VDD connected to the higher potential power terminal and a terminal at potential V− connected to the lower potential power terminal. The transformer 606A includes a primary winding connected between the output of amplifier 604A and the lower potential power line L (to serve as a control input) at potential V−, and a secondary winding connected on the lower potential power line L (across potentials V− and V−') to serve as an output. The turns-ratio of the transformer 606A defines (e.g., equals to or proportional to) the amplification factor $K_2$. The transformer 606A provides a suppression signal that reduces the electromagnetic interference voltage signal from $V_{n0}$ to $V_{n1}$.

In the second circuit unit 600B, the sensing circuit 602B includes a capacitor and a resistor connected in series and across the power line H and potential V− to sense the electromagnetic interference voltage signal $V_{n1}$. The differential amplifier 604B has an input terminal connected to a node between the resistor and the capacitor, and an output terminal connected to the transformer 606B. The amplifier 604B, with an amplification factor $K_1$, is arranged to amplify the signal (e.g., the signal $V_{n1}$) sensed by the sensing circuit 602B by $K_1$. The amplified signal is provided to the transformer 606B, more specifically to the primary coil of the transformer 606B. The amplifier 604B has higher and lower potential power terminals for connection with a power source. In this example, the power source has a terminal at potential VDD connected to the higher potential power terminal and a terminal at potential V− connected to the lower potential power terminal. The transformer 606B includes a primary winding connected between the output of amplifier 604B and the lower potential power line L (to serve as a control input) at potential V−, and a secondary winding connected across potentials VS− and V−' to serve as an output. The turns-ratio of the transformer 606B defines (e.g., equals to or proportional to) the amplification factor $K_2$. The transformer 606B provides a suppression signal that reduces the electromagnetic interference voltage signal $V_{n1}$ to $V_{n2}$.

The amplification factor $K_1$ of amplifier 604A and the amplification factor $K_1$ of amplifier 604B can be the same or different. The amplification factor $K_2$ of the transformer 606A and the amplification factor $K_2$ of transformer 606B can be the same or different. The product of the amplification factor $K_1$ of amplifier 604A and the amplification factor $K_2$ of the transformer 606A can be (but need not be) about −1. Likewise, the product of the amplification factor $K_1$ of amplifier 604B and the amplification factor $K_2$ of the transformer 606B can be (but need not be) about −1.

In this embodiment, a single power supply can be used for powering the amplifiers 604A, 604B without affecting the suppression performance. The reference potential (V−) of the first circuit unit 400A and the reference potential (V−) of the second circuit unit 400B are the same. Importantly, the higher potential power terminals of the amplifiers 604A, 604B are at the same potential while the lower potential power terminals of the amplifiers 604A, 604B are at the same potential different from that of the higher potential power terminals. While in this embodiment V− is used as the reference potential, in other embodiments, V+ can be used as the reference potential, and the higher potential power terminal of the amplifiers 604A, 604B can be connected to V+. The lower potential power terminal of the amplifiers 604A, 604B can be connected to a separate node such as -Vss.

In an alternative embodiment, as differential amplifiers 604A, 604B are used, the controlled voltage sources 606A, 606B may instead be placed on the higher potential power line, between VS+ and V+.

It will be appreciated by persons skilled in the art that numerous variations and/or modifications may be made to the invention as shown in the specific embodiments without departing from the spirit or scope of the invention as broadly described. The references V+, VS+. V−, VS−, V−', V+', and the like in this disclosure may refer to a node, a potential value, or both. Depending on the circuit connections, the different references may or may not be of the same potential. Feature(s) described with respect to one embodiment can be combined with feature(s) described with respect to another embodiment. The described embodiments of the invention should therefore be considered in all respects as illustrative, not restrictive.

For example, the circuit may be used to suppress electromagnetic interference signals and like noise signals on power or signal lines. The electromagnetic interference signals may be in the form of current or voltage. The circuit may include multiple, cascaded circuit units arranged to suppress electromagnetic interference signals in stages. The sensing circuit of the circuit unit may take different form. The amplifier can be formed with different electrical components, including one or more transistors, amplifiers, operational amplifiers, etc. The amplifier may be provided by a circuit, portion, or module in an integrated circuit or integrated circuit chip. The controlled signal source may be a controlled current source or a controlled voltage source.

What is claimed is:

1. A circuit for suppressing electromagnetic interference signal on power lines, comprising:
    a first sensing circuit arranged to sense a first electromagnetic interference signal;

a first amplifier arranged to be powered by a power source, the first amplifier providing a first amplification factor and being operably connected with the first sensing circuit to amplify a signal sensed by the first sensing circuit;

a first controlled signal source providing a second amplification factor and being operably connected with the first amplifier to regulate or further amplify the amplified signal to provide a first suppression signal that reduces the first electromagnetic interference signal;

a second sensing circuit arranged to sense a second electromagnetic interference signal, the second electromagnetic interference signal being the reduced first electromagnetic interference signal;

a second amplifier arranged to be powered by a power source, the second amplifier providing a third amplification factor and being operably connected with the second sensing circuit to amplify a signal sensed by the second sensing circuit; and a second controlled signal source providing a fourth amplification factor and being operably connected with the second amplifier to regulate or further amplify the amplified signal to provide a second suppression signal that reduces the second electromagnetic interference signal;

wherein the first amplifier includes a first higher potential power terminal and a first lower potential power terminal for connection with a power source for the first amplifier, wherein the second amplifier includes a second higher potential power terminal and a second lower potential power terminal for connection with a power source for the second amplifier;

wherein the first amplifier and the second amplifier are arranged to be powered by the same power source such that (i) the first higher potential power terminal and the second higher potential power terminal are at the same first potential and (ii) the first lower potential power terminal and the second lower potential power terminal are at the same second potential.

2. The circuit of claim 1, wherein the second suppression signal substantially eliminates the second electromagnetic interference signal.

3. The circuit of claim 1, wherein the power lines include a higher potential power line and a lower potential power line; and wherein at least one of:
the higher potential power line and the first higher potential power terminal are at the same first potential; and
the lower potential power line and the first lower potential power terminal are at the same second potential.

4. The circuit of claim 1, wherein the first sensing circuit is a high pass circuit, and wherein the high pass circuit consists only of passive circuit components.

5. The circuit of claim 1, wherein the first controlled signal source comprises a transformer with primary coils and second coils operably connected in phase and defining a turns-ratio, the second amplification factor being defined by the turns ratio.

6. The circuit of claim 1, wherein the first amplifier comprises a single input amplifier.

7. The circuit of claim 6, wherein the first sensing circuit comprises a resistor and a capacitor connected in series, and the single input amplifier is connected to a node between the resistor and the capacitor.

8. The circuit of claim 7, wherein the power lines include a higher potential power line and a lower potential power line, and the first controlled signal source is connected at the higher potential power line.

9. The circuit of claim 1, wherein the first amplifier comprises a differential input amplifier.

10. The circuit of claim 9, wherein the first sensing circuit comprises a resistor and a capacitor connected in series, and the differential input amplifier is connected across the resistor and not the capacitor.

11. The circuit of claim 10, wherein the power lines include a higher potential power line and a lower potential power line, and the first controlled signal source is connected at the lower potential power line.

12. The circuit of claim 1, wherein the power lines include a higher potential power line and a lower potential power line; wherein at least one of:
the higher potential power line, the first higher potential power terminal, and the second higher potential power terminal are at the same first potential; and
the lower potential power line, the first lower potential power terminal, and the second lower potential power terminal are at the same second potential.

13. The circuit of claim 1, wherein the second controlled signal source comprises a transformer with primary coils and second coils operably connected in phase and defining a turns ratio, the fourth amplification factor being defined by the turns ratio.

14. An electric device comprising the circuit of claim 1.

15. The circuit of claim 1, wherein the power lines comprise a power supply line and a power return line, wherein the first lower potential power terminal of the first amplifier is connected to the return line, and wherein the first controlled signal source is arranged on the return line between the first amplifier and the second amplifier.

16. A circuit for suppressing electromagnetic interference signal on power lines, comprising a plurality of circuit stages for suppressing an electromagnetic interference signal in stage, wherein each of the plurality of circuit stages includes:

a sensing circuit arranged to sense an electromagnetic interference signal;

an amplifier including a higher potential power terminal and a lower potential power terminal, and arranged to be powered by a power source, the amplifier being operably connected with the sensing circuit to amplify a signal sensed by the sensing circuit; and a controlled signal source being operably connected with the amplifier to regulate or further amplify the amplified signal to provide a suppression signal that reduces the electromagnetic interference signal;

wherein the amplifiers of the plurality of circuit stages are arranged to be powered by the same power source such that the respective higher potential power terminals of the amplifiers are at the same first potential and the respective lower potential power terminals of the amplifiers are at the same second potential.

17. The circuit of claim 16, wherein the power lines comprise a power supply line and a power return line, and wherein the controlled signal sources of the plurality of circuit stages are arranged on the return line.

18. The circuit of claim 17, wherein each of the controlled signal sources of the plurality of circuit stages comprises a respective transformer with primary coils and second coils operably connected in phase and defining a turns-ratio.

\* \* \* \* \*